US008599556B2

(12) United States Patent
Hentschel et al.

(10) Patent No.: US 8,599,556 B2
(45) Date of Patent: Dec. 3, 2013

(54) POWER CONVERTER MODULE WITH COOLED BUSBAR ARRANGEMENT

(75) Inventors: Stefan Hentschel, Weisendorf (DE); Harald Ponath, Hirschaid (DE)

(73) Assignee: Siemens Aktiengesellschaft, München (DE)

( * ) Notice: Subject to any disclaimer, the term of this patent is extended or adjusted under 35 U.S.C. 154(b) by 154 days.

(21) Appl. No.: 13/133,836

(22) PCT Filed: Sep. 29, 2009

(86) PCT No.: PCT/EP2009/062589
§ 371 (c)(1),
(2), (4) Date: Jun. 9, 2011

(87) PCT Pub. No.: WO2010/066484
PCT Pub. Date: Jun. 17, 2010

(65) Prior Publication Data
US 2011/0235276 A1    Sep. 29, 2011

(30) Foreign Application Priority Data
Dec. 10, 2008    (DE) .......................... 10 2008 061 488

(51) Int. Cl.
*H05K 7/20*    (2006.01)
(52) U.S. Cl.
USPC ........................................ 361/699; 361/715
(58) Field of Classification Search
USPC ....................................... 361/699
See application file for complete search history.

(56) References Cited

U.S. PATENT DOCUMENTS

| 5,068,491 | A | 11/1991 | Ogata et al. |
| 5,923,085 | A | 7/1999 | Donegan et al. |
| 6,313,991 | B1 | 11/2001 | Nagashima et al. |
| 6,574,094 | B1 * | 6/2003 | Morrow et al. ............... 361/676 |
| 6,865,080 | B2 * | 3/2005 | Radosevich et al. .......... 361/699 |
| 6,898,072 | B2 * | 5/2005 | Beihoff et al. ................ 361/676 |
| 6,909,607 | B2 * | 6/2005 | Radosevich et al. .......... 361/699 |
| 7,016,192 | B2 * | 3/2006 | Beihoff et al. ................ 361/689 |
| 7,187,548 | B2 * | 3/2007 | Meyer et al. .................. 361/699 |
| 7,952,875 | B2 * | 5/2011 | Woody et al. ................. 361/699 |
| 2004/0060689 | A1 | 4/2004 | Pfeifer et al. |

FOREIGN PATENT DOCUMENTS

| CN | 1533688 A | 9/2004 |
| DE | 298 13 254 U1 | 10/1998 |
| DE | 10 2007 003 875 A1 | 8/2008 |
| EP | 0 407 167 A2 | 1/1991 |
| EP | 1 781 076 A2 | 5/2007 |
| JP | 60 77368 A | 3/1994 |
| JP | 2002 270748 A | 9/2002 |
| JP | 2007 096252 A | 4/2007 |
| WO | WO 2005 109505 A1 | 11/2005 |

* cited by examiner

*Primary Examiner* — Gregory Thompson
(74) *Attorney, Agent, or Firm* — Henry M. Feiereisen LLC

(57)    ABSTRACT

A power converter module with a liquid-cooled heat sink, a busbar arrangement having at least two busbars, at least two power semiconductor modules, which are mechanically connected to the liquid-cooled heat sink for thermal conduction and are electrically connected to connections of the power converter module by the busbar arrangement has at least one coolant line forming a single structural unit with the busbar arrangement. The coolant line prevents additional power loss in the laminated busbar.

4 Claims, 1 Drawing Sheet

POWER CONVERTER MODULE WITH COOLED BUSBAR ARRANGEMENT

CROSS-REFERENCES TO RELATED APPLICATIONS

This application is the U.S. National Stage of International Application No. PCT/EP2009/062589, filed Sep. 29, 2009, which designated the United States and has been published as International Publication No. WO 2010/066484 and which claims the priority of German Patent Application, Serial No. 10 2008 061 488.2, filed Dec. 10, 2008, pursuant to 35 U.S.C. 119(a)-(d).

BACKGROUND OF THE INVENTION

The invention relates to a power converter module with a cooled busbar arrangement.

Power converter modules of the generic type, in particular for relatively high powers, are commercially available. In the case of such power converter modules, their power semiconductor modules, in particular turn-off power semiconductor modules, are connected to connections of the power converter module by a low-inductance busbar arrangement. This is achieved by virtue of the fact that the busbars used are embodied in planar fashion and stacked one above another to form a busbar stack. An insulating layer embodied in planar fashion is arranged in each case between two planar busbars. These insulating layers project beyond the planar busbars in order that limit values for air clearances and creepage paths can be complied with. Consequently, such a low-inductance busbar arrangement has at least two busbars and at least one insulating layer. In order that the busbar arrangement of the employed power semiconductor modules of the power converter module is configured as compactly as possible, this busbar assembly is laminated. By virtue of the materials used, in particular the lamination material, this busbar arrangement has a temperature limit of 105° C., for example.

Since, in the commercially available power semiconductor modules, in particular turn-off power semiconductor modules, for example Insulated Gate Bipolar Transistor (IGBT), the current-carrying capacity continuously increases, the current density correspondingly increases in the busbars of a busbar arrangement, in particular of a laminated busbar arrangement, of a power converter module. This results in a quadratic increase in the losses in the busbar arrangement, such that the temperature of this busbar arrangement likewise increases. The limit temperature of a busbar arrangement is determined by the employed materials of the insulating layers and of the lamination material. Preferably, at the present time, use is made of busbar arrangements that are laminated in power converter modules with an insulating film. In this case, the lamination material of the laminated busbar arrangement sets a temperature limit. For power converter applications, this means a power limitation which is no longer governed by the power semiconductor modules used, but rather by the maximum limit temperature of the corresponding lamination material of the busbar arrangement.

Obvious solutions to this problem include, firstly, increasing the cross section of each busbar of the busbar arrangement, and, secondly, cooling this busbar arrangement, for example by inherent convection. By increasing the cross sections of the busbars of the busbar arrangement, such a busbar arrangement not only is more costly, but also has a higher weight. In order to cool the busbar arrangement by inherent convection, it has to be arranged in a power converter apparatus in such a way that a cooling air stream can flow over this busbar arrangement.

WO 2005/109505 A1 discloses a power semiconductor circuit whose busbar arrangement is cooled. In the case of this power semiconductor circuit, at least one module is soldered on the outer side on a plate-type busbar serving as positive or negative plate. The positive and negative busbars are usually arranged as topmost and bottommost plates, respectively, on a plate busbar assembly. This top busbar, on which the module is applied, is cooled directly by a cooling device, wherein this cooling device is embodied as air or liquid cooling. This cooling device is arranged in a sandwich-like manner between the top busbar and, with the interposition of an insulation, a further plate-type busbar lying in a parallel plane. Furthermore, a busbar on the underside is provided with the interposition of a further insulating layer. These busbars form together with the cooling device a very compact arrangement. The elements of this busbar assembly are connected to one another by lamination. Since this power semiconductor circuit is an inverter, two intermediate circuit capacitors are arranged below this busbar assembly, said capacitors being connected to the upper and lower busbars, respectively, by means of screw connections.

DE 10 2007 003 875 A1 discloses a power converter module comprising at least two power semiconductor modules which are mechanically connected to a cooling body in a thermally conductive manner and are electrically interconnected by means of a laminated busbar arrangement. At least one busbar of this laminated busbar arrangement is thermally linked to the cooling body by means of at least one electrically insulating and thermally conductive supporting element. By means of these supporting elements, at least one busbar of the laminated busbar arrangement is thermally linked to the cooling body. The magnitude of the heat to be dissipated determines the number of thermally conductive supporting elements. By means of these supporting elements, the laminated busbar arrangement is likewise supported in the edge regions. The quantity of heat to be dissipated from the laminated busbar arrangement is restricted by means of these thermally conductive supporting elements.

The invention is based on the object, then, of specifying a power converter module, from the busbar arrangement of which heat can be dissipated using simple means, wherein this power converter module does not have to be rerouted or redesigned.

SUMMARY OF THE INVENTION

This object is achieved according to the invention by a power converter module having a liquid-cooled heat sink, a busbar arrangement having at least two busbars, at least two power semiconductor modules, which are mechanically connected to the liquid-cooled heat sink for thermal conduction and are electrically connected to connections of the power converter module by the busbar arrangement; and at least one coolant line forming a single structural unit with the busbar arrangement.

By virtue of the fact that a coolant line is thermally conductively connected to the busbar arrangement of a power converter module, a power loss produced in the busbar arrangement can be dissipated. As a result, the temperature of the busbar arrangement is lowered, as a result of which the power semiconductor modules used can be fully utilized in terms of power. That is to say that the power converter module according to the invention has a higher power by comparison with a commercially available power converter module. Consequently, the power of a power converter module is no longer determined by the maximum limit temperature of an employed insulating material of the busbar arrangement, but rather is again determined by the power capacity of the power semiconductor modules used.

In one advantageous embodiment of the power converter module according to the invention, the busbar arrangement and the coolant line are laminated with one another. As a result, the busbar arrangement and the coolant line form one structural design, the individual parts of which are spatially fixed with respect to one another. As a result, this cooled busbar arrangement can be handled like any commercially available laminated busbar arrangement.

In a further advantageous embodiment of the power converter module according to the invention, the coolant line is fluidly connected to the liquid-cooled heat sink of the power converter module. Consequently, the coolant line is supplied from the liquid-cooled heat sink of the power converter module, which is also designated as the primary circuit. This has the advantage that the power converter module remains unchanged in respect of its connections.

In a further advantageous embodiment of the power converter module according to the invention, the coolant line is arranged in a meandering fashion along a surface of the busbar arrangement. What is achieved as a result is that heat can be dissipated from approximately the entire surface of the busbar arrangement of the power converter module.

In a further advantageous embodiment of the power converter module according to the invention, two coolant lines are arranged on the surface of the busbar arrangement of the power converter module in such a way that a respective coolant line is arranged in alignment with a respective power semiconductor module. Each coolant line can preferably run in a meandering fashion in such a region. In order that each coolant line, independently of the other coolant line, can dissipate heat from a region of the busbar arrangement in alignment with a power semiconductor module, these two coolant lines are fluidly connected in parallel with one another and with the liquid-cooled heat sink of the power converter module.

BRIEF DESCRIPTION OF THE DRAWING

For further elucidation of the invention, reference is made to the drawing which schematically illustrates an embodiment.

DETAILED DESCRIPTION OF PREFERRED EMBODIMENTS

Figure 1:
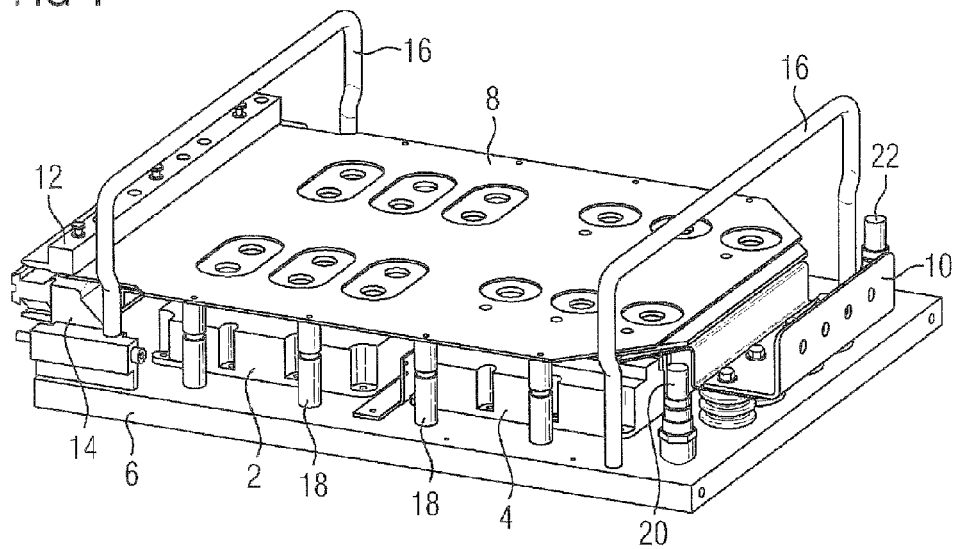
FIG. 1 shows a commercially available power converter module.

In FIG. 1, which illustrates a perspective view of a commercially available power converter module, 2 and 4 in each case designate a power semiconductor module, in particular a turn-off power semiconductor module, for example an insulated gate bipolar transistor (IGBT), 6 designates a liquid-cooled heat sink, 8 designates a busbar arrangement, 10 designates a load connection, 12 and 14 in each case designate a DC voltage connection, 16 designates a clip, and 18 designates supporting elements. In addition, a coolant inlet and outlet are designated by 20 and 22 in this illustration.

The two power semiconductor modules 2 and 4 are mechanically fixed to the liquid-cooled heat sink 6 in a releasable manner. The busbar arrangement 8 can have two busbars, for example one positive busbar and one load busbar or one load busbar and one negative busbar, or three busbars, for example one positive, load and negative busbar. The number of busbars of the busbar arrangement 8 is dependent on the electrical interconnection of the two power semiconductor modules 2 and 4. If these two power semiconductor modules 2 and 4 are electrically connected in parallel, then the busbar arrangement 8 only has two busbars. By contrast, if these two power semiconductor modules 2 and 4 are electrically connected in series and form a phase module of a power converter, then the busbar arrangement 8 has three busbars. If the power converter module is used as a phase module, then the three busbars of the busbar arrangement 8 are one positive, load and negative busbar. These busbars are arranged one above another, wherein an insulating layer is arranged in each case between two busbars, and laminated.

This busbar arrangement 8 is placed on the electrical connections of each power semiconductor module 2 and 4. These electrical connections can be soldering pins or threaded bolts. Starting from a predetermined power capacity of the power semiconductor module 2, 4, the power semiconductor modules 2, 4 have as electrical connections only threaded bolts. In accordance with the interconnection of the two power semiconductor modules 2, 4, the connections thereof are in each case electrically conductively connected to a predetermined busbar of the laminated busbar arrangement 8. This laminated busbar arrangement 8 is supported not only on the connections of the power semiconductor modules 2, 4, but also on a plurality of supporting elements 18. The latter are arranged along a respective longitudinal side of the power converter module.

Since a liquid-cooled heat sink 6 is provided as the cooling body of this power converter module, this liquid-cooled heat sink has a coolant inlet 20 and a coolant outlet 22. With these coolant inlet and outlet 20 and 22, the power converter module is fluidly connected to a coolant circuit. Any liquid, in particular tap water, can be used as the cooling liquid.

Since the current-carrying capacity of the power semiconductor modules 2, 4 used in the power converter module continuously increases, the current in the busbars of the laminated busbar arrangement 8 also rises. This results in a quadratic increase in the losses in the laminated busbar arrangement 8. As a result, the temperature in the laminated busbar arrangement 8 rises. The possible magnitude of the limit temperature of the laminated busbar arrangement 8 is dependent on the materials used. That is to say that the lamination material of the busbar arrangement 8 fixes the temperature limit. That means for power converter applications a power limitation which is no longer determined by the power semiconductor modules 2, 4 used, but rather by the material-specific limit temperature of a lamination material.

Figure 2:
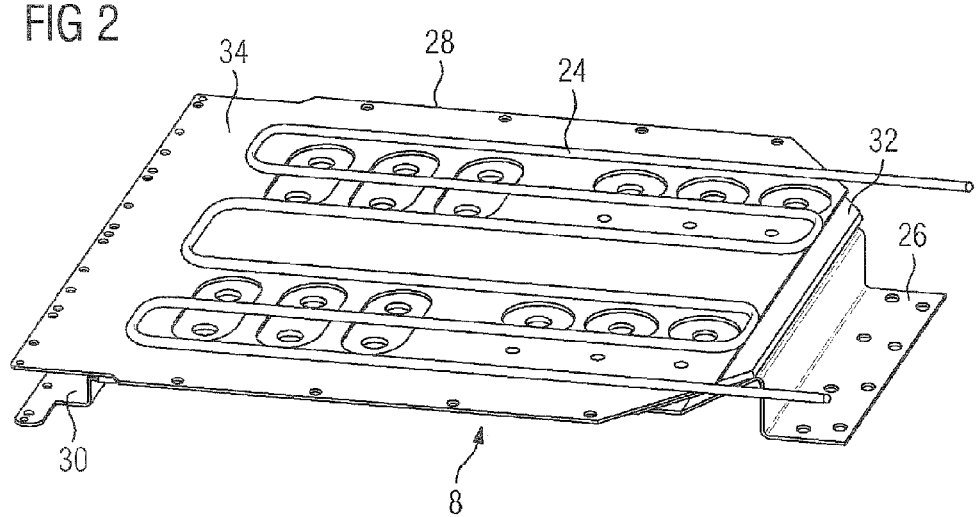
FIG. 2 illustrates a busbar arrangement of a power converter module according to the invention.

In order to be able to dissipate the power loss produced in the laminated busbar arrangement 8, this busbar arrangement 8 is provided with a coolant line 24 (FIG. 2). This coolant line 24 is connected in terms of coolant to the liquid circuit of the liquid-cooled heat sink 6. The liquid circuit of the liquid-cooled heat sink 6 is designated as the primary circuit, and the liquid circuit of the coolant line 24 is designated as the secondary circuit. The primary and secondary circuits can be connected for fluid conduction in parallel or in series.

For the sake of clarity, FIG. 2 perspectively illustrates only the busbar arrangement 8 with a coolant line 24, the elements of the busbar arrangement 8 and the coolant line 24 not yet being laminated with one another. As already mentioned, a power converter module as phase module of a polyphase power converter has two power semiconductor modules 2 and 4, which are electrically connected in series. The junction point of this series connection of two power semiconductor modules 2 and 4 forms an AC voltage connection 10, in particular a load connection. A busbar 26, also designated as load busbar, of the busbar arrangement 8 is electrically conductively connected to this load connection 10. The DC voltage connections 12 and 14 of the power converter module are in each case electrically conductively connected to a busbar 28 and 30, respectively, which are also designated as positive and negative busbar, respectively. These busbars 26, 28 and 30 are arranged spatially one above another, wherein an insulating layer 32 is in each case arranged between two adjacent busbars 26, 28 and 28, 30. Consequently, a commercially available busbar arrangement of a phase module has at least five layers. In order that these layers are mechanically fixed in relation to one another, this stack of three busbars 26, 28 and 30 and at least two insulating layers 32 is laminated with one another. In addition, the required air clearances and creepage paths are complied with as a result.

In the perspective illustration in accordance with FIG. 2, the busbar arrangement 8 has only three layers, namely a lower layer, in which the negative and load busbars 30 and 26 are arranged, an insulating layer, in which the insulating layer 32 is arranged, and an upper layer, in which the positive busbar 28 is arranged. No additional insulating layer is arranged on the surface 34 of the upper and lower busbars 28 and 30, respectively, of the busbar arrangement 8. The insulation of these surfaces 34 is performed by the laminate.

According to the invention, this busbar arrangement 8 is now provided with a coolant line 24, which is laid in a meandering fashion on the surface 34 of the positive busbar 28 in this illustration in FIG. 2. This coolant line 24 can likewise be laid in a meandering fashion on the surface 34 of the lower busbar 30. It is also possible for a respective surface 34 of the upper and lower busbars 28 and 30 to be provided with a coolant line 24. In this case, the meanders are respectively arranged in the region of the connections of the two power semiconductor modules 2 and 4. Instead of one coolant line 24, it is also possible to arrange two or more coolant lines 24 onto the busbar arrangement 8, in particular on the surface 34 of the positive or negative busbar 28 or 30. If this busbar arrangement 8 is utilized for electrically connecting the two power semiconductor modules 2 and 4 to the three connections 10 and 12 of the power converter module, it is advantageous if two coolant lines 24 are provided. These two coolant lines 24 are arranged on the surface 34 of the positive busbar 28 of the busbar arrangement 8 in such a way that a respective coolant line 24, in particular the meanders thereof, are arranged in alignment with a power semiconductor module 2 and 4, respectively, on the busbar arrangement 8. That is to say that the meanders of each coolant line 24 are respectively arranged in a region of the surface 34 of the positive busbar 28 which covers a power semiconductor module 2 or 4 respectively arranged underneath. In order that each coolant line 24 independently of one another can dissipate heat from a region of the busbar arrangement 8, these two coolant lines 24 are fluidly connected in parallel. Moreover, the two coolant lines 24 are fluidly connected to the liquid-cooled heat sink 6 of the power converter module. Since only a fraction of the cooling liquid of the primary circuit is required for cooling the busbar arrangement 8, the cooling circuit of the busbar arrangement 8, which is designated as the secondary circuit, is fluidly connected in parallel with the primary circuit. That is to say that one end of the coolant line 24 is linked to the coolant inlet 20, whereas the other end of the coolant line 24 is linked to the coolant outlet 22 of the primary circuit. One advantage of this connection of two coolant circuits is that the power converter module remains unchanged in respect of connections.

Since, in accordance with the perspective illustration of the busbar arrangement 8 with a coolant line 24 according to FIG. 2, the surface 34 of the positive busbar 28 of the busbar arrangement 8 is not provided with an insulating layer, the coolant line 24 has to be composed of an insulating, but highly thermally conductive material, since the coolant flowing through the coolant line 24 exhibits potential. The coolant line 24 may be made of an electrically non-conductive plastic material. If an insulating layer is present on said surface 34, the coolant line need not be insulating. In order that the elements of the busbar arrangement 8 are not spatially displaced relative to one another during lamination, they are spatially fixed. This likewise applies to the coolant line 24. The latter is fixed in its position on the surface 34 of the positive busbar 28 of the busbar arrangement 8. For this purpose, said coolant line 24 can be adhesively bonded to said surface 34. The lamination results in a coolable busbar arrangement 8 that can be handled like a commercially available laminated busbar arrangement. As a result of the lamination, the stack of busbars 26, 28 and 30, an insulating layer 32 and the coolant line 24 acquires a mechanical strength.

By virtue of this coolant line 24 applied on the busbar arrangement 8, the temperature of the busbar arrangement is lowered, as a result of which the power semiconductor modules 2 and 4 used can be fully utilized in terms of power. That is to say that the power converter module has a higher power by comparison with a power converter module without a cooled busbar arrangement 8, since the power of this power converter module is no longer determined by a maximum limit temperature of an employed lamination material of the busbar arrangement 8, but rather is determined by the power capacity of the power semiconductor modules 2 and 4 used.

The invention claimed is:

1. A power converter module, comprising:
    a liquid-cooled heat sink;
    a busbar arrangement having at least two busbars which are electrically isolated from one another;
    at least two power semiconductor modules, which are mechanically connected to the liquid-cooled heat sink for thermal conduction and are electrically connected to connections of the power converter module by the busbar arrangement; and
    at least one coolant line forming a single structural unit with the busbar arrangement,
    wherein the busbar arrangement and the at least one coolant line are laminated with one another.

2. The power converter module of claim 1, wherein the at least one coolant line is connected to the liquid-cooled heat sink for fluid conduction.

3. The power converter module of claim 1, wherein the at least one coolant line is arranged in a meander pattern extending along a surface of the busbar arrangement.

4. The power converter module of claim 1, wherein the at least one coolant line is made of an electrically non-conductive plastic material.

* * * * *